United States Patent
Prabhu et al.

(10) Patent No.: US 10,181,457 B2
(45) Date of Patent: Jan. 15, 2019

(54) MICROELECTRONIC PACKAGE FOR WAFER-LEVEL CHIP SCALE PACKAGING WITH FAN-OUT

(71) Applicant: Invensas Corporation, San Jose, CA (US)

(72) Inventors: Ashok S. Prabhu, San Jose, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/332,991

(22) Filed: Oct. 24, 2016

(65) Prior Publication Data

US 2017/0117260 A1    Apr. 27, 2017

Related U.S. Application Data

(60) Provisional application No. 62/246,517, filed on Oct. 26, 2015.

(51) Int. Cl.
*H01L 23/00* (2006.01)
*H01L 23/31* (2006.01)
(Continued)

(52) U.S. Cl.
CPC ........ *H01L 25/105* (2013.01); *H01L 21/4846* (2013.01); *H01L 21/4885* (2013.01); *H01L 23/3128* (2013.01); *H01L 24/02* (2013.01); *H01L 24/14* (2013.01); *H01L 21/568* (2013.01); *H01L 2021/60* (2013.01); *H01L 2224/02373* (2013.01); *H01L 2224/02375* (2013.01); *H01L 2224/02379* (2013.01);
(Continued)

(58) Field of Classification Search
CPC ............ H01L 2224/02379; H01L 2224/02373
See application file for complete search history.

(56) References Cited

U.S. PATENT DOCUMENTS 2,230,663 A    2/1941   Alden
3,289,452 A   12/1966   Koellner
(Continued)

FOREIGN PATENT DOCUMENTS

CN    1352804 A    6/2002
CN    1641832 A    7/2005
(Continued)

OTHER PUBLICATIONS

International Search Report and Written Opinion for Appln. No. PCT/US2013/041981, dated Nov. 13, 2013.
(Continued)

*Primary Examiner* — David A Zarneke

(57) ABSTRACT

Apparatuses and methods relating generally to a microelectronic package for wafer-level chip scale packaging with fan-out are disclosed. In an apparatus, there is a substrate having an upper surface and a lower surface opposite the upper surface. A microelectronic device is coupled to the upper surface with the microelectronic device in a face-up orientation. Wire bond wires are coupled to and extending away from the upper surface. Posts of the microelectronic device extend away from a front face thereof. Conductive pads are formed in the substrate associated with the wire bond wires for electrical conductivity.

6 Claims, 9 Drawing Sheets

(51) Int. Cl.
  *H01L 25/10* (2006.01)
  *H01L 21/48* (2006.01)
  *H01L 21/56* (2006.01)
  *H01L 21/60* (2006.01)

(52) U.S. Cl.
  CPC .............. *H01L 2224/04105* (2013.01); *H01L 2224/12105* (2013.01); *H01L 2224/14131* (2013.01); *H01L 2224/14133* (2013.01); *H01L 2224/14135* (2013.01); *H01L 2224/14163* (2013.01); *H01L 2224/14177* (2013.01); *H01L 2224/16227* (2013.01); *H01L 2224/32245* (2013.01); *H01L 2224/73267* (2013.01); *H01L 2224/81005* (2013.01); *H01L 2225/1023* (2013.01); *H01L 2225/1035* (2013.01); *H01L 2225/1041* (2013.01); *H01L 2225/1058* (2013.01); *H01L 2924/15192* (2013.01); *H01L 2924/15311* (2013.01); *H01L 2924/19107* (2013.01)

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,867,267 A | 9/1989 | Carlson |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,977,640 A | 11/1999 | Bertin et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |

(56) References Cited

U.S. PATENT DOCUMENTS

| | | |
|---|---|---|
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,472,743 B2 | 10/2002 | Huang et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,741,085 B1 | 5/2004 | Khandros et al. |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,317 B2 | 8/2004 | Fjelstad |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,780,746 B2 | 8/2004 | Kinsman et al. |
| 6,787,926 B2 | 9/2004 | Chen et al. |
| 6,790,757 B1 | 9/2004 | Chittipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Karnezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |

(56) References Cited

U.S. PATENT DOCUMENTS

| | | |
|---|---|---|
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,262,506 B2 | 8/2007 | Mess et al. |
| 7,268,421 B1 | 9/2007 | Lin |
| 7,276,785 B2 | 10/2007 | Bauer et al. |
| 7,276,799 B2 | 10/2007 | Lee et al. |
| 7,287,322 B2 | 10/2007 | Mahieu et al. |
| 7,290,448 B2 | 11/2007 | Shirasaku et al. |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,378,726 B2 | 5/2008 | Punzalan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,485,969 B2 | 2/2009 | Corisis et al. |
| 7,495,179 B2 | 2/2009 | Kubota et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,528,474 B2 | 5/2009 | Lee |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,560,360 B2 | 7/2009 | Cheng et al. |
| 7,564,116 B2 | 7/2009 | Ahn et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaku et al. |
| 7,605,479 B2 | 10/2009 | Mohammed |
| 7,612,638 B2 | 11/2009 | Chung et al. |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,670,940 B2 | 3/2010 | Mizukoshi et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,683,482 B2 | 3/2010 | Nishida et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,800,233 B2 | 9/2010 | Kawano et al. |
| 7,807,512 B2 | 10/2010 | Lee et al. |
| 7,808,093 B2 | 10/2010 | Kagaya et al. |
| 7,808,439 B2 | 10/2010 | Yang et al. |
| 7,815,323 B2 | 10/2010 | Saeki |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,876,180 B2 | 1/2011 | Uchimura |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,910,385 B2 | 3/2011 | Kweon et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 8,008,121 B2 | 8/2011 | Choi et al. |
| 3,017,437 A1 | 9/2011 | Yoo et al. |
| 3,017,452 A1 | 9/2011 | Ishihara et al. |
| 3,020,290 A1 | 9/2011 | Sheats |
| 8,012,797 B2 | 9/2011 | Shen et al. |
| 8,018,033 B2 | 9/2011 | Moriya |

(56) References Cited

U.S. PATENT DOCUMENTS

| | | |
|---|---|---|
| 8,018,065 B2 | 9/2011 | Lam |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,237,257 B2 | 8/2012 | Yang |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,390,108 B2 | 3/2013 | Cho et al. |
| 8,390,117 B2 | 3/2013 | Shimizu et al. |
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,492,201 B2 | 7/2013 | Pagaila et al. |
| 8,502,387 B2 | 8/2013 | Choi et al. |
| 8,507,297 B2 | 8/2013 | Iida et al. |
| 8,508,045 B2 | 8/2013 | Khan et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,567,051 B2 | 10/2013 | Val |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 | 12/2013 | Sato et al. |
| 8,624,374 B2 | 1/2014 | Ding et al. |
| 8,633,059 B2 | 1/2014 | Do et al. |
| 8,637,991 B2 | 1/2014 | Haba |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,670,261 B2 | 3/2014 | Crisp et al. |
| 8,680,662 B2 | 3/2014 | Haba et al. |
| 8,680,677 B2 | 3/2014 | Wyland |
| 8,680,684 B2 | 3/2014 | Haba et al. |
| 8,685,792 B2 | 4/2014 | Chow et al. |
| 8,686,570 B2 | 4/2014 | Semmelmeyer et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,152 B2 | 7/2014 | Co et al. |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,135 B2 | 8/2014 | Oganesian et al. |
| 8,796,846 B2 | 8/2014 | Lin et al. |
| 8,802,494 B2 | 8/2014 | Lee et al. |
| 8,810,031 B2 | 8/2014 | Chang et al. |
| 8,811,055 B2 | 8/2014 | Yoon |
| 8,816,404 B2 | 8/2014 | Kim et al. |
| 8,816,505 B2 | 8/2014 | Mohammed et al. |
| 8,835,228 B2 | 9/2014 | Mohammed |
| 8,836,136 B2 | 9/2014 | Chau et al. |
| 8,836,140 B2 | 9/2014 | Ma et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |
| 8,893,380 B2 | 11/2014 | Kim et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,948,712 B2 | 2/2015 | Chen et al. |

(56) References Cited

U.S. PATENT DOCUMENTS

| | | |
|---|---|---|
| 8,963,339 B2 | 2/2015 | He et al. |
| 8,970,049 B2 | 3/2015 | Kamezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,128,123 B2 | 9/2015 | Liu et al. |
| 9,136,254 B2 | 9/2015 | Zhao et al. |
| 9,142,586 B2 | 9/2015 | Wang et al. |
| 9,153,562 B2 | 10/2015 | Haba et al. |
| 9,167,710 B2 * | 10/2015 | Mohammed .......... H01L 21/565 |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,449 B2 | 4/2016 | Hasch et al. |
| 9,318,452 B2 | 4/2016 | Chen et al. |
| 9,324,696 B2 | 4/2016 | Choi et al. |
| 9,330,945 B2 | 5/2016 | Song et al. |
| 9,349,706 B2 | 5/2016 | Co et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,405,064 B2 | 8/2016 | Herbsommer et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,508,622 B2 | 11/2016 | Higgins |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 2001/0042925 A1 | 11/2001 | Yamamoto et al. |
| 2002/0014004 A1 | 2/2002 | Beaman et al. |
| 2002/0125556 A1 | 9/2002 | Oh et al. |
| 2002/0171152 A1 | 11/2002 | Miyazaki |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0162378 A1 | 8/2003 | Mikami |
| 2004/0041757 A1 | 3/2004 | Yang et al. |
| 2004/0262728 A1 | 12/2004 | Sterrett et al. |
| 2005/0017369 A1 | 1/2005 | Clayton et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0161814 A1 | 7/2005 | Mizukoshi et al. |
| 2005/0173807 A1 | 8/2005 | Zhu et al. |
| 2005/0176233 A1 | 8/2005 | Joshi et al. |
| 2006/0087013 A1 | 4/2006 | Hsieh |
| 2006/0216868 A1* | 9/2006 | Yang .................. H01L 23/3114 |
| | | 438/125 |
| 2006/0255449 A1 | 11/2006 | Lee et al. |
| 2007/0010086 A1 | 1/2007 | Hsieh |
| 2007/0080360 A1 | 4/2007 | Mirsky et al. |
| 2007/0164457 A1 | 7/2007 | Yamaguchi et al. |
| 2007/0190747 A1 | 8/2007 | Hup |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0042265 A1 | 2/2008 | Merilo et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111233 A1* | 5/2008 | Pendse ................ H01L 23/3121 |
| | | 257/712 |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0217708 A1 | 9/2008 | Reisner et al. |
| 2008/0246126 A1* | 10/2008 | Bowles ............... H01L 23/3114 |
| | | 257/659 |
| 2008/0280393 A1 | 11/2008 | Lee et al. |
| 2008/0284045 A1 | 11/2008 | Gerber et al. |
| 2008/0303153 A1 | 12/2008 | Oi et al. |
| 2008/0308305 A1 | 12/2008 | Kawabe |
| 2009/0008796 A1 | 1/2009 | Eng et al. |
| 2009/0014876 A1 | 1/2009 | Youn et al. |
| 2009/0032913 A1 | 2/2009 | Haba |
| 2009/0085185 A1 | 4/2009 | Byun et al. |
| 2009/0091009 A1 | 4/2009 | Corisis et al. |
| 2009/0102063 A1 | 4/2009 | Lee et al. |
| 2009/0127686 A1 | 5/2009 | Yang et al. |
| 2009/0128176 A1 | 5/2009 | Beaman et al. |

(56) References Cited

U.S. PATENT DOCUMENTS

| | | |
|---|---|---|
| 2009/0140415 A1 | 6/2009 | Furuta |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0256229 A1 | 10/2009 | Ishikawa et al. |
| 2009/0261466 A1* | 10/2009 | Pagaila .............. H01L 21/6835 257/686 |
| 2009/0315579 A1 | 12/2009 | Beaman et al. |
| 2010/0032822 A1 | 2/2010 | Liao et al. |
| 2010/0044860 A1 | 2/2010 | Haba et al. |
| 2010/0078795 A1 | 4/2010 | Dekker et al. |
| 2010/0193937 A1 | 8/2010 | Nagamatsu et al. |
| 2010/0200981 A1 | 8/2010 | Huang et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0042699 A1 | 2/2011 | Park et al. |
| 2011/0068478 A1 | 3/2011 | Pagaila et al. |
| 2011/0157834 A1 | 6/2011 | Wang |
| 2011/0209908 A1 | 9/2011 | Lin et al. |
| 2011/0215472 A1 | 9/2011 | Chandrasekaran |
| 2012/0001336 A1 | 1/2012 | Zeng et al. |
| 2012/0043655 A1 | 2/2012 | Khor et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0126431 A1 | 5/2012 | Kim et al. |
| 2012/0153444 A1 | 6/2012 | Haga et al. |
| 2012/0184116 A1 | 7/2012 | Pawlikowski et al. |
| 2013/0001797 A1 | 1/2013 | Choi et al. |
| 2013/0040423 A1 | 2/2013 | Tung |
| 2013/0049218 A1 | 2/2013 | Gong et al. |
| 2013/0087915 A1 | 4/2013 | Warren et al. |
| 2013/0153646 A1 | 6/2013 | Ho |
| 2013/0200524 A1 | 8/2013 | Han et al. |
| 2013/0234317 A1 | 9/2013 | Chen et al. |
| 2013/0256847 A1 | 10/2013 | Park et al. |
| 2013/0323409 A1 | 12/2013 | Read et al. |
| 2013/0328178 A1 | 12/2013 | Bakalski et al. |
| 2014/0035892 A1 | 2/2014 | Shenoy et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0225248 A1 | 8/2014 | Henderson et al. |
| 2014/0239479 A1 | 8/2014 | Start |
| 2014/0239490 A1 | 8/2014 | Wang |
| 2014/0308907 A1 | 10/2014 | Chen |
| 2014/0312503 A1 | 10/2014 | Seo |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0206865 A1 | 7/2015 | Yu et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0200566 A1 | 7/2016 | Ofner et al. |
| 2016/0225692 A1 | 8/2016 | Kim et al. |
| 2017/0117231 A1 | 4/2017 | Awujoola et al. |
| 2017/0229432 A1 | 10/2017 | Lin et al. |

FOREIGN PATENT DOCUMENTS

| | | | |
|---|---|---|---|
| CN | 1877824 A | | 12/2006 |
| CN | 101409241 A | | 4/2009 |
| CN | 101449375 A | | 6/2009 |
| CN | 101675516 A | | 3/2010 |
| CN | 101819959 A | | 9/2010 |
| CN | 102324418 A | | 1/2012 |
| DE | 102009001461 A1 | | 9/2010 |
| EP | 920058 | | 6/1999 |
| EP | 1449414 A1 | | 8/2004 |
| EP | 2234158 A1 | | 9/2010 |
| JP | S51-050661 | | 5/1976 |
| JP | 59189069 | | 10/1984 |
| JP | 61125062 A | | 6/1986 |
| JP | S62158338 A | | 7/1987 |
| JP | 62-226307 | | 10/1987 |
| JP | 1012769 A | | 1/1989 |
| JP | 64-71162 | | 3/1989 |
| JP | 1118364 | | 5/1989 |
| JP | H04-346436 A | | 12/1992 |
| JP | 06268015 A | | 9/1994 |
| JP | H06268101 A | | 9/1994 |
| JP | H06333931 A | | 12/1994 |
| JP | 07-122787 A | | 5/1995 |
| JP | 09505439 | | 5/1997 |
| JP | H1065054 A | | 3/1998 |
| JP | H10135220 A | | 5/1998 |
| JP | H10135221 A | | 5/1998 |
| JP | 11-074295 A | | 3/1999 |
| JP | 11135663 A | | 5/1999 |
| JP | H11-145323 A | | 5/1999 |
| JP | 11251350 A | | 9/1999 |
| JP | H11260856 A | | 9/1999 |
| JP | 11317476 | | 11/1999 |
| JP | 2000156461 A | | 6/2000 |
| JP | 2000323516 A | | 11/2000 |
| JP | 3157134 B2 | | 4/2001 |
| JP | 2001196407 A | | 7/2001 |
| JP | 2001326236 A | | 11/2001 |
| JP | 2002050871 A | | 2/2002 |
| JP | 2002289769 A | | 10/2002 |
| JP | 2003122611 A | | 4/2003 |
| JP | 2003-174124 A | | 6/2003 |
| JP | 2003197668 A | | 7/2003 |
| JP | 2003307897 A | | 10/2003 |
| JP | 2003318327 A | | 11/2003 |
| JP | 2004031754 A | | 1/2004 |
| JP | 2004047702 A | | 2/2004 |
| JP | 2004048048 A | | 2/2004 |
| JP | 2004-172157 A | | 6/2004 |
| JP | 2004-200316 A | | 7/2004 |
| JP | 2004281514 A | | 10/2004 |
| JP | 2004-319892 A | | 11/2004 |
| JP | 2004327855 A | | 11/2004 |
| JP | 2004327856 A | | 11/2004 |
| JP | 2004343030 A | | 12/2004 |
| JP | 2005011874 A | | 1/2005 |
| JP | 2005033141 A | | 2/2005 |
| JP | 2005093551 A | | 4/2005 |
| JP | 2003377641 A | | 6/2005 |
| JP | 2005142378 A | | 6/2005 |
| JP | 2005175019 A | | 6/2005 |
| JP | 2003426392 A | | 7/2005 |
| JP | 2005183880 A | | 7/2005 |
| JP | 2005183923 A | | 7/2005 |
| JP | 2005203497 A | | 7/2005 |
| JP | 2005302765 A | | 10/2005 |
| JP | 2006108588 A | | 4/2006 |
| JP | 2006186086 A | | 7/2006 |
| JP | 2006344917 | | 12/2006 |
| JP | 2007123595 A | | 5/2007 |
| JP | 2007-208159 A | | 8/2007 |
| JP | 2007194436 A | | 8/2007 |
| JP | 2007234845 A | | 9/2007 |
| JP | 2007287922 A | | 11/2007 |
| JP | 2007-335464 A | | 12/2007 |
| JP | 200834534 A | | 2/2008 |
| JP | 2008166439 A | | 7/2008 |
| JP | 2008171938 A | | 7/2008 |
| JP | 2008235378 A | | 10/2008 |
| JP | 2008251794 A | | 10/2008 |
| JP | 2008277362 A | | 11/2008 |
| JP | 2008306128 A | | 12/2008 |
| JP | 2009004650 A | | 1/2009 |
| JP | 2009044110 A | | 2/2009 |
| JP | 2009506553 A | | 2/2009 |
| JP | 2009508324 A | | 2/2009 |
| JP | 2009064966 A | | 3/2009 |
| JP | 2009088254 A | | 4/2009 |
| JP | 2009111384 A | | 5/2009 |

(56) References Cited

FOREIGN PATENT DOCUMENTS

| | | | |
|---|---|---|---|
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 A1 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 10-2007-0058680 A | 6/2007 |
| KR | 20080020069 | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 101215271 B1 | 12/2012 |
| KR | 20130048810 A | 5/2013 |
| KR | 20150012285 A | 2/2015 |
| TW | 200539406 A | 12/2005 |
| TW | 200721327 A | 6/2007 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| TW | I605558 B | 11/2017 |
| WO | 9615458 A1 | 5/1996 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2007116544 A1 | 10/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Preliminary Report on Patentability for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/STMicroelectronics France, May 21, 2010, 28 pages.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, [ISR Appln. No. PCT/US2012/060402, dated Feb. 21, 2013 provides concise stmt. of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003, 34 pages.
North Corporation, Processed intra-Layer Interconnection Material for PWBs [Etched Copper Bump with Copper Foil], NMBITM, Version 2001.6.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2013.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 102106326, dated Dec. 13, 2013.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
U.S. Appl. No. 13/477,532, dated May 22, 2012.
U.S. Office Action for U.S. Appl. No. 12/769,930, dated May 5, 2011.
3D Plus "Wafer Level Stack—WDoD", [online] [Retrieved Aug. 5, 2010] Retrieved from internet: <http://www.3d-plus.com/techno-wafer-level-stack-wdod.php>, 2 pages.
Written Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
Chinese Office Action Search Report for Application No. 2014800551784 dated Jan. 23, 2018.
European Search Report for Appln. No. EP12712792, dated Feb. 27, 2018, 2 pages.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
International Search Report and Written Opinion for Appln. No. PCT/US2015/032679, dated Nov. 11, 2015.

(56) References Cited

OTHER PUBLICATIONS

International Search Report and Written Opinion for Appln. No. PCT/US2016/056526, dated Jan. 20, 2017.
International Search Report and Written Opinion for Appln. No. PCT/US2016/068297, dated Apr. 17, 2017.
Partial International Search Report for Appln. No. PCT/US2015/032679, dated Sep. 4, 2015.
Taiwan Search Report for 105128420, dated Sep. 26, 2017.
International Search Report and Written Opinion for Appln. No. PCT/US2017/064437, dated Mar. 29, 2018.
Bang, U.S. Appl. No. 10/656,534, filed Sep. 5, 2003.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
EE Times Asia "Freescale Cuts Die Area, Thickness with New Packaging Tech" [online] [Retrieved Aug. 5, 2010] Retrieved from internet: <http://www.eetasia.com/ART_8800428222_280300_NT_DEC52276.htm>, Aug. 3, 2006, 2 pages.
Extended European Search Report for Appln. No. EP13162975, dated Sep. 5, 2013.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
Partial Search Report—Invitation to Pay Fees for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2013.
International Search Report and Written Opinion for Appln. No. PCT/US2013/026126, dated Jul. 25, 2013.
International Search Report and Written Opinion for Appln. No. PCT/US2013/052883, dated Oct. 21, 2013.

\* cited by examiner

MICROELECTRONIC PACKAGE FOR WAFER-LEVEL CHIP SCALE PACKAGING WITH FAN-OUT

RELATED APPLICATIONS

This patent application claims the benefit of priority to U.S. Provisional Patent Application No. 62/246,517 to Prabhu et al., entitled, "Microelectronic Package for Wafer-Level Chip Scale Packaging with Fan-Out," filed Oct. 26, 2015 and incorporated herein by reference in its entirety.

FIELD

The following description relates to integrated circuit ("IC") packaging. More particularly, the following description relates to microelectronic packages for wafer-level chip scale packaging with fan-out.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example.

More recently, fan-out wafer-level chip scale packaging ("FO-WCSP") has been used to reduce costs. Semiconductor dies are formed, such as in their smallest configurations, and these dies or a combination of different dies may then be molded together in what is known as a reconstituted wafer. This reconstituted wafer provides more surface area for interconnects using WCSP in combination with a fan-out technology, such as a lead frame, ball grid array, or other fan-out technology. This allows for a larger pitch for interconnection to a PCB or other circuit board.

Accordingly, it would be desirable and useful to provide for FO-WCSP for a package-on-package ("PoP") configuration or other die stacking configuration.

BRIEF SUMMARY

An apparatus relates generally to a microelectronic package for wafer-level chip scale packaging with fan-out. In such an apparatus, there is a substrate having an upper surface and a lower surface opposite the upper surface. A microelectronic device is coupled to the upper surface with the microelectronic device in a face-up orientation. Wire bond wires are coupled to and extending away from a face of the microelectronic device facing away from the substrate. Posts of the microelectronic device extend away from a front face thereof. Conductive pads are formed in the substrate.

A method relates generally to forming a microelectronic package for wafer-level chip scale packaging with fan-out. In such a method, obtained is a substrate having an upper surface and a lower surface opposite the upper surface. A microelectronic device having posts is coupled in a face-up orientation to the upper surface of the substrate. Wire bond wires are bonded to the upper surface of the substrate for extending away therefrom to a height above the posts. The substrate, the microelectronic device and the wire bond wires in combination is molded with a molding material layer. An uppermost portion of the wire bond wires and an uppermost portion of the molding material layer is removed to upper ends of the posts. Conductive pads are formed in the substrate. The conductive pads are for the wire bond wires for electrical conductivity between the wire bond wires and the conductive pads associated therewith.

An apparatus relates generally to another microelectronic package for wafer-level chip scale packaging with fan-out. In such an apparatus, a substrate has an upper surface and a lower surface opposite the upper surface. The substrate includes conductive pads formed therein. Wire bond wires are coupled to and extend away from a first portion of the conductive pads along the upper surface for electrical conductivity between the wire bond wires and the first portion of the conductive pads associated therewith. A microelectronic device is coupled to a second portion of the conductive pads along the upper surface with the microelectronic device in a face-down orientation.

A method relates generally to another microelectronic package for wafer-level chip scale packaging with fan-out. In such a method, obtained is a substrate having an upper surface and a lower surface opposite the upper surface. Conductive pads are formed in the substrate. Wire bond wires are bonded to the conductive pads along the upper surface of the substrate for extending away therefrom. The conductive pads are for the wire bond wires for electrical conductivity between the wire bond wires and the conductive pads associated therewith. A microelectronic device is coupled in a face-down orientation to the upper surface of the substrate with interconnects. The substrate, the microelectronic device and the wire bond wires in combination is molded with a molding material layer.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 2 is a block diagram of a top view depicting an exemplary in-process microelectronic package.

FIG. 3 is a block diagram of a top view depicting an exemplary in-process microelectronic package after forming balls on a redistribution layer ("RDL").

FIG. 4 is a block diagram of a cross-sectional side view depicting an exemplary package-on-package ("PoP") microelectronic package.

FIG. 5 is a block diagram of a cross-sectional side view depicting another exemplary PoP microelectronic package.

FIG. 6 is a flow diagram depicting an exemplary process flow for forming a microelectronic package for WCSP with FO.

FIGS. 7-1 through 7-6 are a progression of block diagrams of a cross-sectional side view depicting formation of another exemplary in-process microelectronic package for WCSP with fan-out FO.

FIG. 8 is a flow diagram depicting an exemplary process flow for forming another microelectronic package for WCSP with fan-out FO.

FIG. 9 is a block diagram of a cross-sectional side view depicting an exemplary PoP microelectronic package.

DETAILED DESCRIPTION

Figure 1:
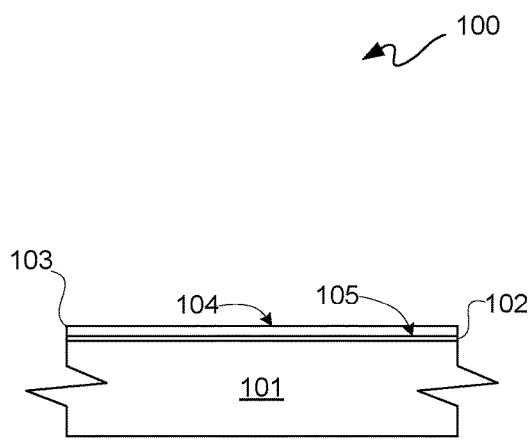
FIGS. 1-1 through 1-9 are a progression of block diagrams of a cross-sectional side view depicting formation of an exemplary in-process microelectronic package for wafer-level chip scale package ("WCSP") with fan-out ("FO").

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Moreover, the features described herein as well as the numerical instances thereof are for purposes of conveying with clarity one or more aspects of exemplary apparatus(es) and/or method(s) described herein. These features are not to scale, and numerical instances thereof in an actual implementation may be the same or different from the numerical instances illustratively depicted. It should be understood that the word "exemplary" is used herein to mean "serving as an example, instance, or illustration." Any example or feature described herein as "exemplary" is not necessarily to be construed as preferred or advantageous over other examples or features.

Generally, an integrated circuit die includes a substrate of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate as provided from an in-process wafer is generally described below, any sheet or layer semiconductor material or dielectric material, such as ceramic or glass for example, may be used as a substrate.

A substrate includes an upper surface and a lower surface that extend in lateral directions and are generally parallel to each other at a thickness thereof. Use of terms such as "upper" and "lower" or other directional terms is made with respect to the reference frame of the figures and is not meant to be limiting with respect to potential alternative orientations, such as in further assemblies or as used in various systems.

An upper surface may generally be associated with what is referred to as a "front side" of an in-process wafer, and a lower surface may generally be associated with what is referred to as a "back side" of an in-process wafer. However, upper and lower may be reversed during processing. Along those lines, a front-side of an in-process wafer may be used for forming what is referred to as front-end-of-line ("FEOL") structures and back-end-of-line ("BEOL") structures. Generally, FEOL structures may include shallow trench isolations ("STI"), transistor gates, transistor source/drain regions (not shown), transistor gate dielectrics (not shown), contact etch stop layer ("CESL"; not shown), a pre-metallization dielectric or pre-metal dielectric ("PMD"), and contact plugs, among other FEOL structures. A PMD may be composed of one or more layers. Generally, BEOL structures may include one or more inter-level dielectrics ("ILDs") and one or more levels of metallization ("M"). Each ILD may be composed of one or more dielectric layers, and each metal or metallization level may be composed of one or more metal layers, as well as one or more barrier and/or liner layers. Additionally, metal from a metallization level may extend through one or more ILDs, as is known. A passivation level may be formed on a last metallization layer. Such passivation level may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

Balls or other discrete interconnects may be respectively formed on bonding pads, where such pads may be formed on or as part of metal layer. Balls may be formed of a bonding material, such as solder or other bonding material. Balls may be microbumps, C4 bumps, ball grid array ("BGA") balls, or some other die interconnect structure. In some applications, metal layer may be referred to as a landing pad. BGA, lead frame, and other types of interconnects may be used as fan-out technologies.

The following description is for fan-out wafer-level chip scale packaging ("FO-WCSP for a stacked or 3D device, such as for a package-on-package PoP device. Along those lines, wire bond wires are used for interconnection with an upper package of a PoP device. Use of wire bond wires as described below may eliminate a substrate and/or corresponding through substrate vias used in a conventionally manufactured PoP device with fan-out. Thus, a lower cost and thinner PoP device with fan-out may be manufactured using wire bond wires as described hereinbelow. Along those lines, a PoP device with fan-out using wire bond wires, such as of a BVA™ technology, may be used in mobile devices and other small form factor applications.

Figures 1, 2:
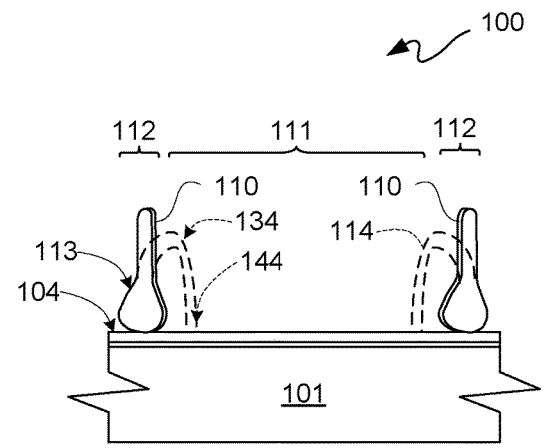
Figures 1, 2, 3:
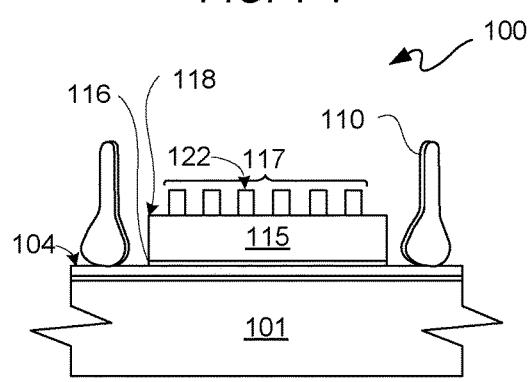
Figures 1, 2, 3, 4:
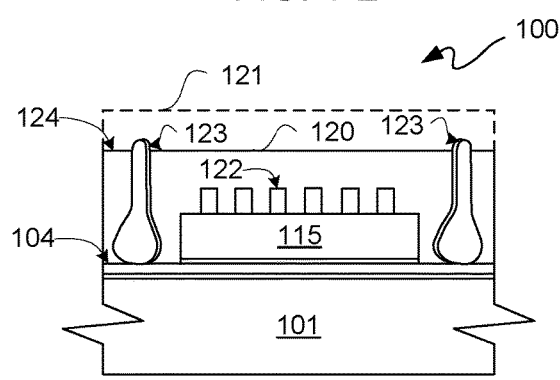
Figures 1, 2, 3, 4, 5:
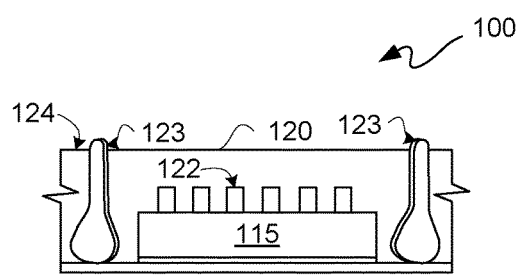

FIGS. 1-1 through 1-9 (collectively and singly "FIG. 1") are a progression of block diagrams of a cross-sectional side view depicting formation of an exemplary in-process microelectronic package 100 for wafer-level chip scale package ("WCSP") with fan-out ("FO"). FIGS. 1, 4 and 5 hereof are described with simultaneous reference to FIG. 6, where there is shown a flow diagram depicting an exemplary process flow 600 for forming a microelectronic package 100 for WCSP with FO.

At 601, a substrate having an upper surface and a lower surface opposite the upper surface is obtained. With reference to FIG. 1-1, in-process microelectronic package 100 includes a carrier 101 coupled to a foil substrate layer 103 with a releasable adhesive 102. In this example implementation, carrier 101 is a copper carrier, and foil substrate layer 103 is copper foil layer. However, in other implementations, carrier 101 may be silicon, glass, laminate, or other dielectric and/or metal carrier material. Carrier 101 may or may not be opaque, such as with respect to UV rays for example. Along those lines, releasable adhesive 102 may be a thermal or UV released adhesive for example. Moreover, in other implementations, foil substrate layer 103 may be another electrical conductor, such as gold, platinum or other thin film metal for example. Foil substrate layer ("substrate") 103 has an upper surface 104 and a lower surface 105 opposite such upper surface 104.

At 602, wire bond wires may be bonded to the upper surface of the substrate for extending away therefrom to a height above posts of a microelectronic device. With reference to FIG. 1-2, wire bond wires 110 are coupled to and extend away from upper surface 104. In this example, copper wire bond wires 110 are used. However, in another implementation, another form of wire bond wires 110 may be used, such as aluminum, silver, gold, palladium-coated copper ("PCC"), core wires, or other forms of wire bond wire. Wire bond wires 110 may be BVA™ bonded wires. Columns and/or rows ("rows") 112 of wire bond wires 110 may be spaced apart from one another to define a region 111 and may be coupled to upper surface 104.

In this example, wire bond wires 110 are ball bonded with corresponding ball bonds 113 to upper surface 104. However, in another implementation, stitch, wedge, compliant, or other forms of BVA bonding may be used. For this implementation, which does not use soldering of wire bond wires 110, copper wire bond wires 110 may be attached with ball bonds to upper surface 104 of substrate 103 for substrate-to-upper package routing.

In another example, a "wired-arch" or "wired-loop" wire bond wire 114 may be formed on upper surface 104 such that a first bond, such as a ball bond 113 for example, is formed at a first location on upper surface 104 and a second bond, such as a wedge or stitch bond 144, is formed at a second location on upper surface 104 spaced apart from such first location by at least approximately 10-400 microns for example. An upper surface 134 of such a "wired-arch" wire bond wire 114 may be used for interconnection, as described elsewhere herein. However, for purposes of clarity by way of example and not limitation, generally only wire bond wires 110, and not wired-arch wire bond wires 114, are further described.

Ball bonds 113, as well as wire bond wires 110 drawn therefrom, may be spaced apart from one another. Even though only single rows 112 spaced apart from one another are illustratively depicted in FIG. 1-2, in other implementations one or more rows 112 may be on one or more sides of region 111 defined by such rows 112. However, for purposes of clarity by way of example and not limitation, it shall be assumed that a single row 112 is located on each side of region 111 for defining such region for receipt of a microelectronic device. Moreover, wire bond wires 110 may extend to a height above posts of such a microelectronic device, as described below in additional detail.

At 603, a microelectronic device having posts may be coupled in a face-up orientation to the upper surface of the substrate. In another implementation, operations at 602 and 603 may be in reverse order. With reference to FIG. 1-3, a microelectronic device 115 may be coupled to upper surface 104 with an adhesive or an underfill 116 in region 111. Microelectronic device 115 may be spaced apart from ball bonds 113 after coupling to upper surface 104. Adhesive 116 may be a compliant material after curing, such as a polyimide ("PI") or a polybenzoxazole ("PBO") for example, with a modulus of elasticity of less than approximately 4 gigapascals ("GPa").

Microelectronic device 115 may be coupled to upper surface 104 in a face-up or front side up orientation. Generally, a face of microelectronic device 115 having posts extending away therefrom, such a face may be facing away from such substrate to which microelectronic device 115 is coupled in this implementation. Even though wire bond wires 110 are attached to upper surface 104 in this example prior to coupling microelectronic device 115, this order may be reversed in this or another implementation. Microelectronic device 115 may be a packaged or bare integrated circuit die formed using a Si, GaAs, or other semiconductor wafer. Optionally, microelectronic device 115 may be a passive device.

Along an upper surface 118 of microelectronic device 115, conductive posts or pads 117 of microelectronic device 115 extend away from a front side or face thereof, namely upper surface 118. In this example, upper ends 122 of electrically conductive posts or pads 117 are over and above an upper surface 118 of microelectronic device 115. In this example, copper posts or pads 117 are used. However, in another example, another type of electrically conductive material may be used for posts or pads 117. Furthermore, a structure other than posts or pads 117, such as stud bumps for example, may be attached along upper surface 118 of microelectronic device 115. Stud bumps may be a ball bonds, such as a ball bond-only portion of wire bonds. Additionally, posts or pads 117 may be formed with a metalization layer used in forming microelectronic device 115. For purposes of clarity by way of example and not limitation, it shall be assumed that copper posts 117 are used for interconnects.

Even though a single instance of an exemplary in-process microelectronic package 100 is illustratively depicted, two or more of such in-process microelectronic packages 100 may be used. In another example, such in-process microelectronic package 100 may be a portion of a reconstituted wafer having multiple in-process microelectronic packages 100. A reconstituted wafer typically consist of dies coupled to one another by a molding material in-between them to form a wafer or substrate.

At 604, the substrate, the microelectronic device and the wire bond wires assemblage or combination may be molded with a molding material layer, which may include grinding or polishing of a surface of such molding material layer. With reference to FIG. 1-4, a molding material layer 120 may be formed over upper surface 104, microelectronic device 115 and wire bond wires 110. In this example, tips or upper ends 123 of wire bond wires 110 are above an upper surface 124 of molding material layer 120. For a wired-arch wire bond wire 114, an upper surface 134 of such a wire arch 114 may be embedded or protrude above an upper surface 124 of molding material layer 120. Along those lines, wire bond wires 110 may extend above upper ends 122 of posts 117. Thus, while tips 123 of wire bond wires 110, or upper surface 134 of wired-arch wire bond wires 114, may be exposed after forming molding material layer 120, upper ends 122 of post 117 are covered by molding material layer 120. In another implementation, molding layer 120 may cover tips 123, or upper surfaces 134, as generally indicated by dashed line 121. For purposes of clarity by way of example and not limitation, it shall be assumed that tips 123 are exposed after forming molding material layer 120. Molding material layer 120 may be for forming a reconstituted wafer having multiple in-process microelectronic packages 100.

With reference to FIG. 1-5, after molding, carrier 101 may be removed along with adhesive 102. Again, adhesive 102 may be a releasable adhesive using temperature, UV rays, and/or other releasing agent.

With reference to FIG. 1-6, molding material layer 120, as well as tips 123 of wire bond wires 110, may be ground or polished down to expose upper ends 122. Removal of material such as by grinding may occur before or after removal of carrier 101. After grinding, upper ends 130 of wire bond wires 110, as well as upper ends 122 of posts 117, may be exposed for interconnections respectively thereto. However, after grinding, molding material layer 120 may be left in place around posts 117 and remaining portions of wire bond wires 110. For a wired-arch wire bond wire 114, after grinding of upper surface 134 of such a wire arch 114, first and second bonds thereof may be electrically disconnected from one another for example by grinding a protruding upper surface 134 to cause a break in such wire arch 114 leaving two at least temporarily exposed upper ends along upper surface 134. Along those lines, grinding may effectively form two separate wire bonds with different bond types, for example a ball bond 113 and a wedge or stitch bond 144.

With reference to FIG. 2, where there is shown a block diagram of a top view depicting an exemplary in-process microelectronic package 100. For this implementation, upper surface 124 may be generally co-planar with upper ends 122 and 130 after grinding. Posts 117 may be in region 111 defined by rows and columns of wire bond wires 110 surrounding microelectronic device 115.

At 605, the wire bond wires and the posts may be interconnected with a redistribution layer. With reference to FIG. 1-7, a redistribution layer ("RDL") 135 may be formed with a bottom surface thereof interconnected to upper ends 122 of posts 117 and upper ends 130 of wire bond wires 110 for interconnecting at least a portion of wire bond wires 110 with at least a portion of posts 117. Even though a single layer of a dielectric layer 137 and a conductive layer 136 is illustratively depicted for RDL 135, in other implementations, RDL 135 may include one or more dielectric and conductive layers. Along those lines, an integrated circuit die may be interconnected to conductive pads on a lower surface of a substrate, as described below in additional detail.

RDL 135 may be entirely formed on upper surface 124 of molding material layer 120, as well as being interconnect to upper ends 130 of wire bond wires 110 and to upper ends 122 of posts 117. In a conventional FOWLP package, an RDL is formed on top of a Si substrate and then surrounded with molding material, and so a large stress field is developed around a transition area or "triple point" where such RDL, Si substrate and molding material intersect. In contrast, by covering an area of a microelectronic device 115 with molding material layer 120 as described herein, RDL 135 avoids a conventional "triple point."

Traces or pads 169 of conductive layer 136 may interconnect upper ends 122 of posts 117 and upper ends 130 of wire bond wires 110. Accordingly, wire bond wires 110 may provide "vertical interconnects" along sides of a microelectronic device for interconnecting substrate 103 and RDL 135. Such wire bond wires 110 may additionally be interconnected to corresponding posts 117 of microelectronic device 115.

At 606, conductive pads may be formed in the substrate electrically isolated from a remainder of the substrate, where the conductive pads correspond to the wire bond wires for electrical conductivity between the wire bond wires and the conductive pads corresponding thereto. With reference to FIG. 1-8, in-process microelectronic package 100 may be flipped for patterning and etching a lower surface 105 of substrate 103, namely a back side of microelectronic package 100. In another implementation, a direct write etch may be used on lower surface 105.

Through substrate channels 142 may be formed from lower surface 105 to upper surface 104 with a stop molding layer 120 for example. Through substrate channels 142 may be at least partially, if not completely, filled with a dielectric material 143, such as a polyimide for example. Conductive pads 140 may be defined by such through substrate channels 142 in copper substrate 103 for this example implementation. Conductive pads or conductive islands 140 may have previously been coupled to wire bond wires 110, as previously described with reference to bonding to upper surface 104 of substrate 103. Conductive pads 140 may be defined in substrate 103 as respective islands of a material of such substrate. Even though conductive pads 140 are illustratively depicted near an outer edge of microelectronic package 100, conductive pads 140 may be formed in generally a middle region ("remainder") 141, such as directly below microelectronic device 115 for example.

Conductive pads 140 may be formed using substrate 103 material for electrical isolation from a remainder 141 of substrate 103. Such remainder 141 may be used as a ground plane. In some instances, no conductive pad 140 may be associated with a wire bond wire 110 for coupling to a ground plane, or other voltage plane. Conductive pads 140 corresponding to wire bond wires 110 for electrical conductivity therebetween may be used for electrical communication with microelectronic package 100 and/or another microelectronic package as described below in additional detail. Although not illustratively depicted in FIG. 1, another redistribution layer RDL may be formed on a top surface of substrate 103. This RDL, like RDL 135, may include one or more dielectric and conductive layers.

At 607, first interconnects may be attached to a top surface of the redistribution layer for electrical conductivity with the posts and the wire bond wires. With reference to FIG. 1-9, balls or bumps 145 may be formed on exposed surfaces of traces or pads 169 of conductive layer 136. Such balls or bumps 145 may be mechanically isolated from electrical conductivity by one or more dielectric layers 137 of an RDL 135. However, such conductive traces or pads 169 of conductive layer 136 may be coupled for electrical conductivity with wire bond wires 110, as well as one or more posts 117, as previously described. Balls or bumps 145 for interconnection with posts 117 and not wire bond wires 110 are not illustratively depicted in this figure for purposes of clarity and not limitation.

With reference to FIG. 3, where there is shown a block diagram of a top view depicting an exemplary in-process microelectronic package 100 after forming balls 145 on RDL 135. Some of balls 145 may be associated with pads or traces 169 of conductive layer 136 for coupling to wire bond wires. Others of balls 145 may be associated with pads or traces 169 of conductive layer 136 not associated with wire bond wires 110 and associated with posts 117. Moreover, even though generally a one-to-one correspondence between wire bond wires 110 coupled to posts 117 is illustratively depicted, wire bond wires 110 may be interconnected to more than one post 117. In one or more instances, there may not be a direct coupling for an electrical connection between at least one wire bond wire 110 and at least one post 117.

Pitch 148 of pads 169 of conductive layer 136 for balls 145 associated with wire bond wires 110 may be in a range of approximately 350 to 600 microns or less for correspondence with pitch of contacts on a PCB or other circuit board. Along those lines, minimum pitch of posts 117 and wire bond wires 110 may be as small as 5 microns and as small as 20 microns, respectively. An RDL 135 may effectively cause pitch 148 to be at least approximately the same as for example a BGA pitch of a circuit board, such as approximately 350 microns.

At 608, second interconnects of another microelectronic device may be coupled to the conductive pads for electrical conductivity with the wire bond wires. With reference to FIG. 4, there is shown a block diagram of a cross-sectional side view depicting an exemplary PoP microelectronic package 300. In this example, a microelectronic package 100, which may still be in a reconstituted wafer or may be diced therefrom, has coupled on the back side thereof another microelectronic package 200. In other words, PoP microelectronic package 300 may be package-to-package assembled, package-to reconstituted wafer assembled, or wafer/reconstituted wafer to reconstituted wafer assembled, with the last three involving subsequent dicing. In this example, microelectronic devices 115 and 201 are respective packaged integrated circuit dies; however, in another example either or both microelectronic devices 115 and 201 may be bare integrated circuit dies. In an example, microelectronic package 100 may be an applications processor or a baseband processor or any other logic device, and microelectronic package 200 may be a memory device, such as with one or more types of memory die including NAND, DRAM, memory controller, and/or the like.

Bumps or balls 155 of microelectronic package 200 may be physically coupled to conductive pads 140 of microelectronic package 100 for electrical conductivity between microelectronic packages 100 and 200. PoP microelectronic package 300 may be coupled to a PCB or other circuit board 160 which is not part of PoP microelectronic package 300. Overall height 400 of PoP microelectronic package 300 may be approximately 1.5 mm or less. Optionally, an underfill (not shown) may be injected between microelectronic packages 100 and 200.

With reference to FIG. 5, there is shown a block diagram of a cross-sectional side view depicting another exemplary PoP microelectronic package 300. In this example, a microelectronic package 100, which may still be in a reconstituted wafer or may be diced therefrom, has formed on a back side thereof another RDL 165. Another microelectronic package 200 may be coupled to an optional RDL 165. Along those lines, a bottom surface of RDL 165 may be interconnected to conductive pads 140 of microelectronic package 100 for electrical conductivity therewith. Either or both of RDLs 135 and/or 165 may have one or more metal layers and/or one or more dielectric layers.

Bumps or balls 155 of microelectronic package 200 may be physically coupled to conductive pads 164 of RDL 165 of microelectronic package 100 for electrical conductivity between microelectronic packages 100 and 200. PoP microelectronic package 300 may be coupled to a PCB or other circuit board 160 not part of PoP microelectronic package 300. Overall height 400 of PoP microelectronic package 300 may be approximately 1.5 mm or less. Wire bond wires 110 may be disposed around a perimeter of microelectronic device 115, which may be packaged integrated circuit die or a bare integrated circuit die.

Figures 1, 2, 3, 4, 5, 6:
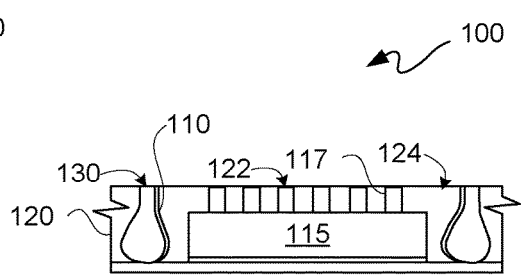
Figures 1, 2, 3, 4, 5, 6, 7:
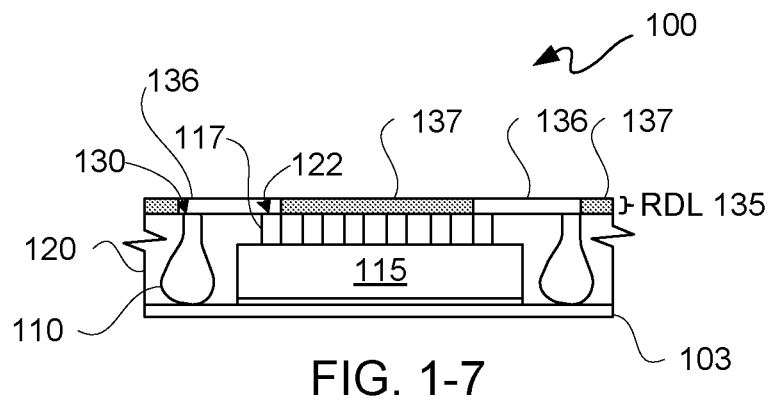
Figures 1, 2, 3, 4, 5, 6, 7, 8:
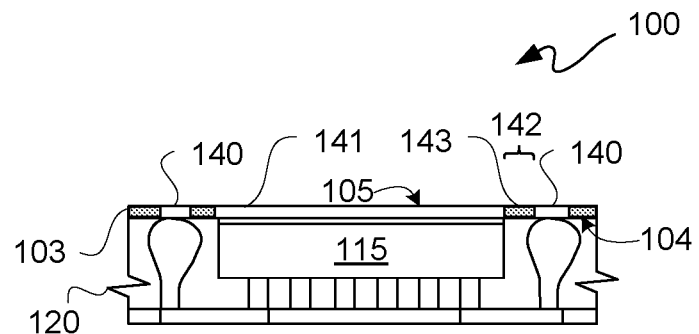
Figures 1, 2, 3, 4, 5, 6, 7, 8, 9:
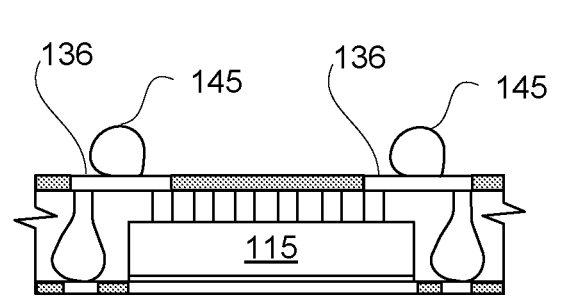
Figure 2:
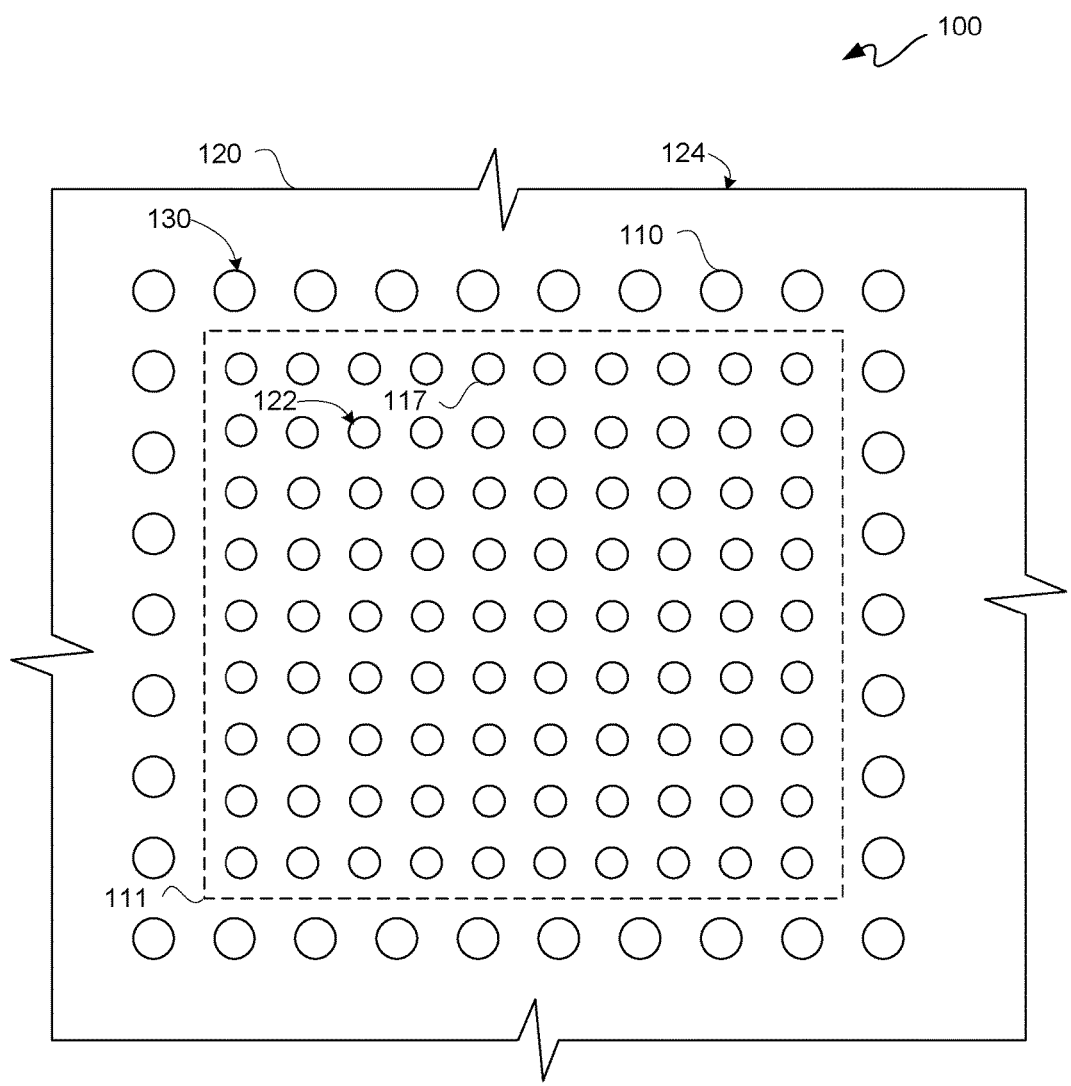
Figure 3:
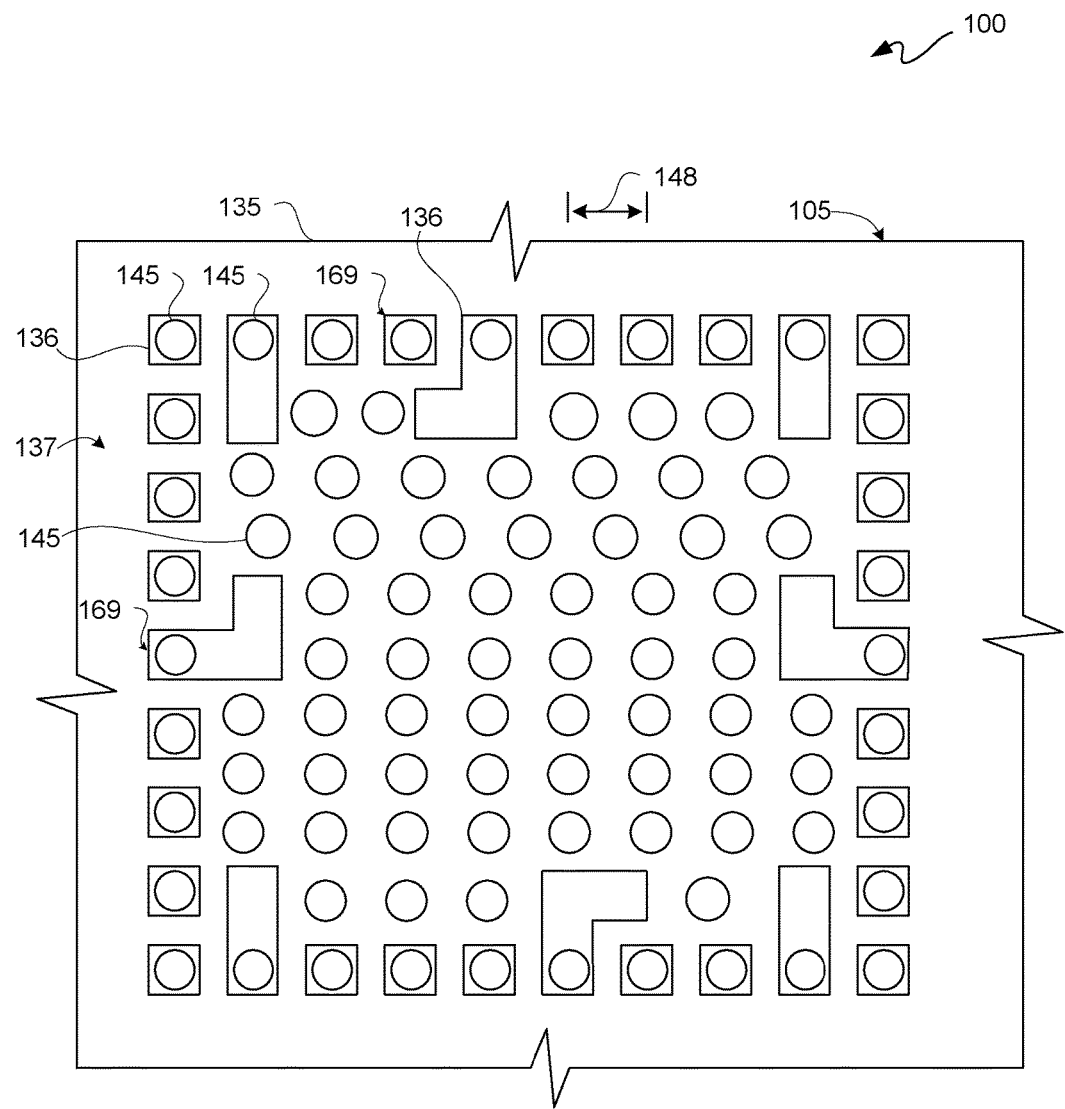
Figure 4:
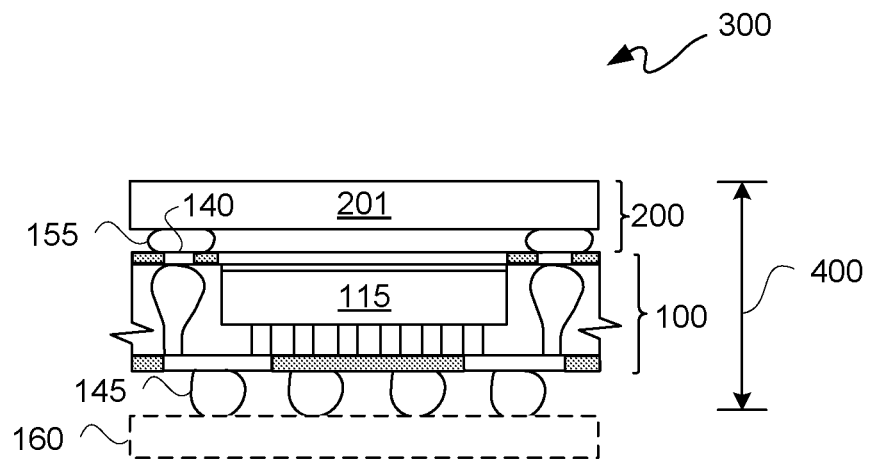
Figure 5:
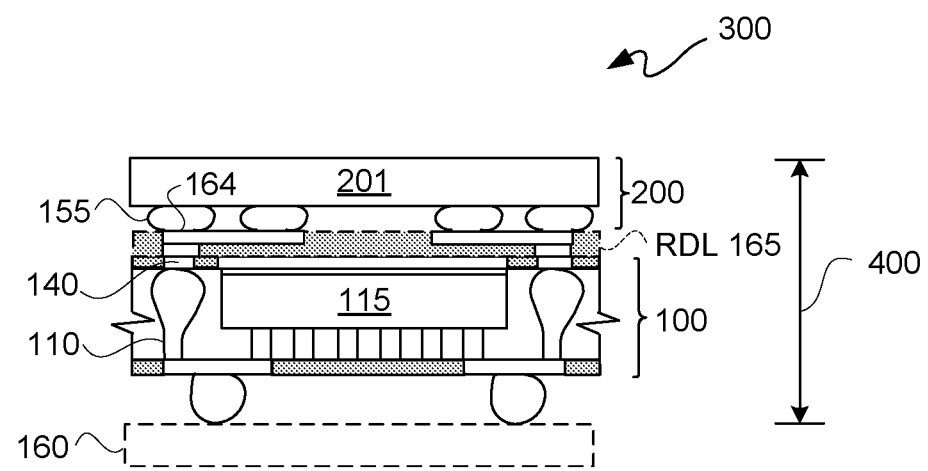
Figure 6:
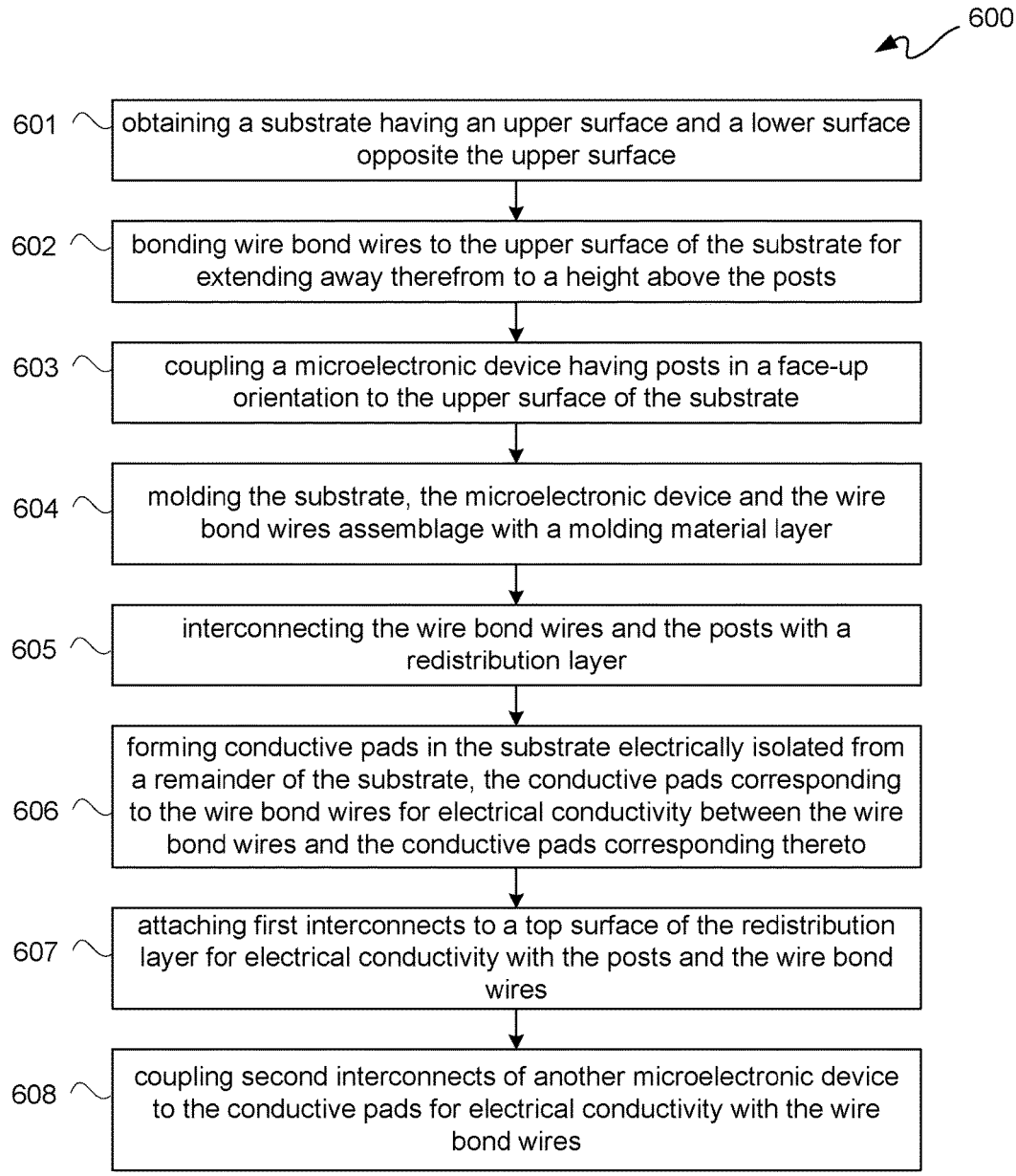
Figures 1, 7:
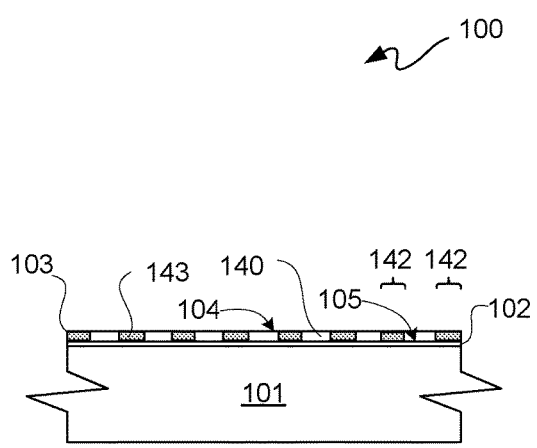
Figures 2, 7:
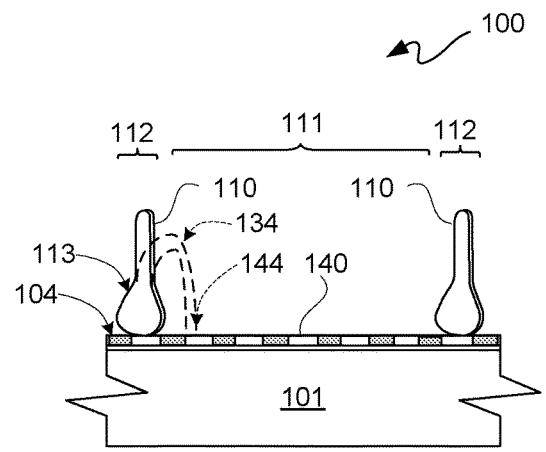
Figures 3, 7:
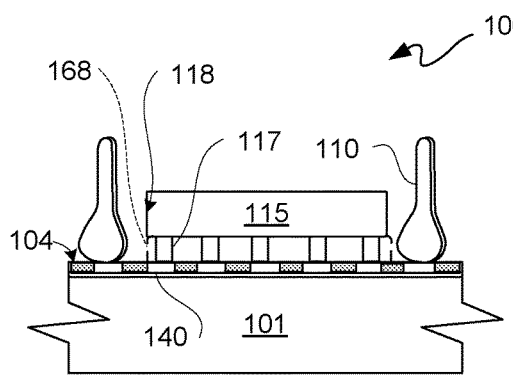
Figures 4, 7:
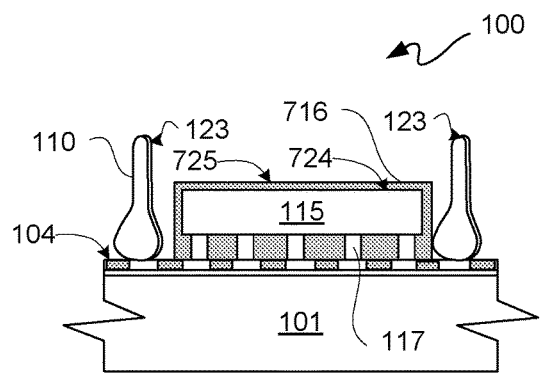
Figures 5, 7:
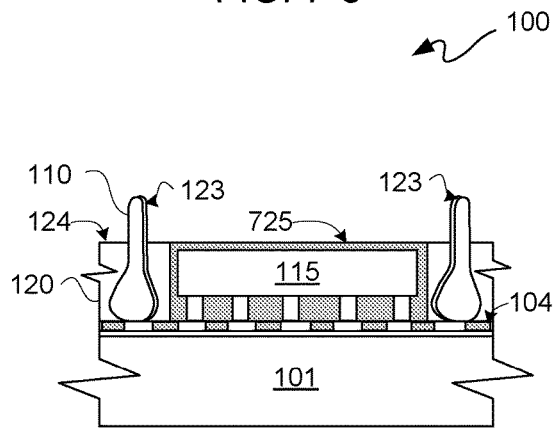
Figures 6, 7:
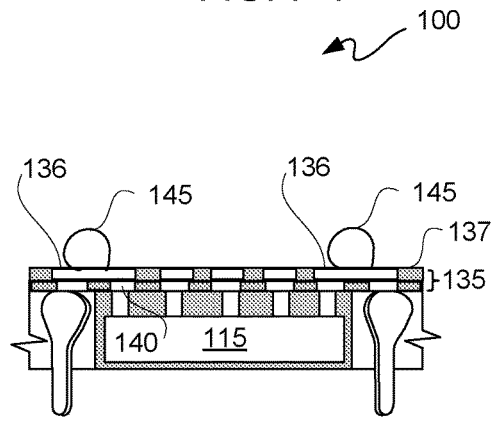
Figure 8:
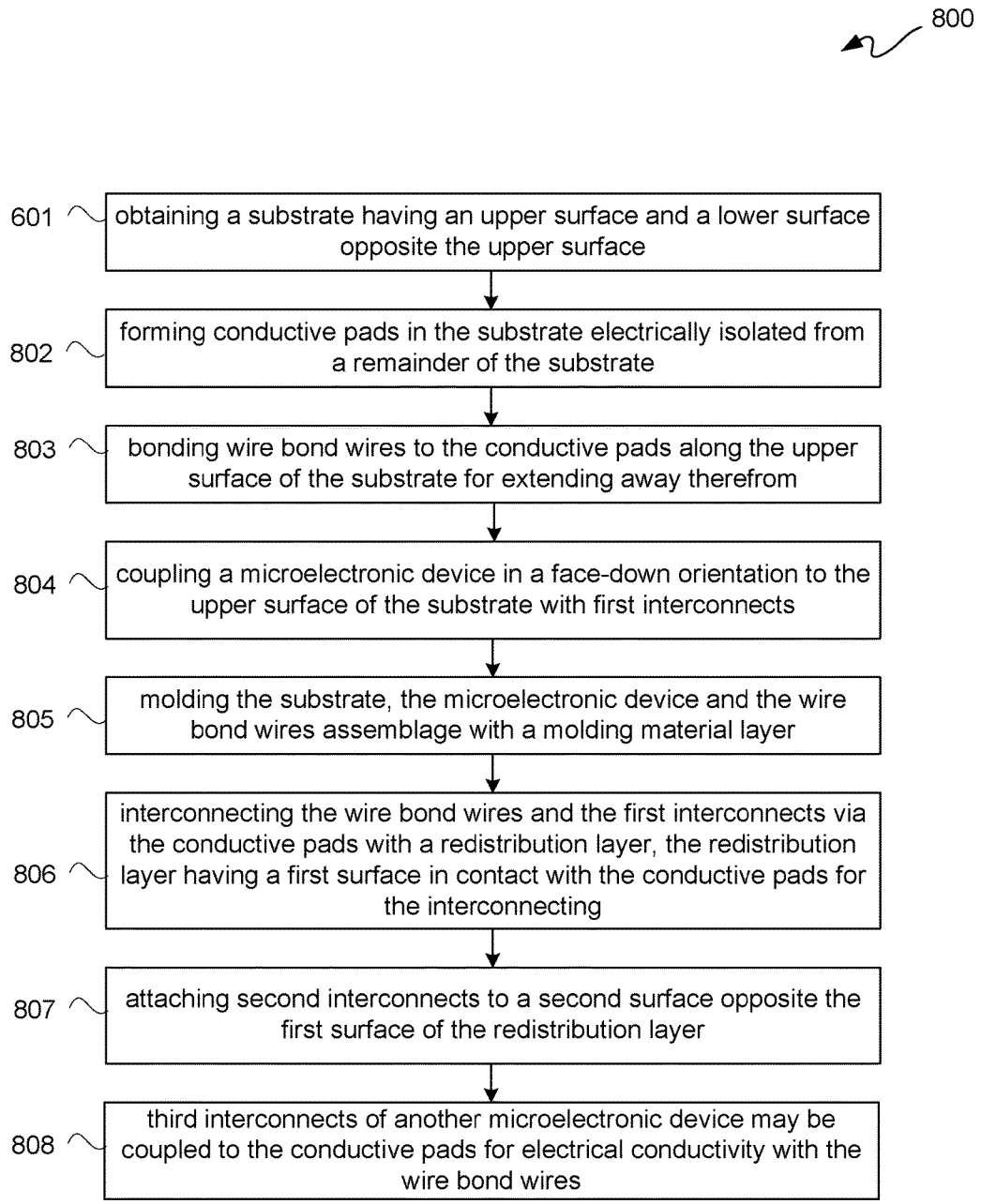
Figure 9:
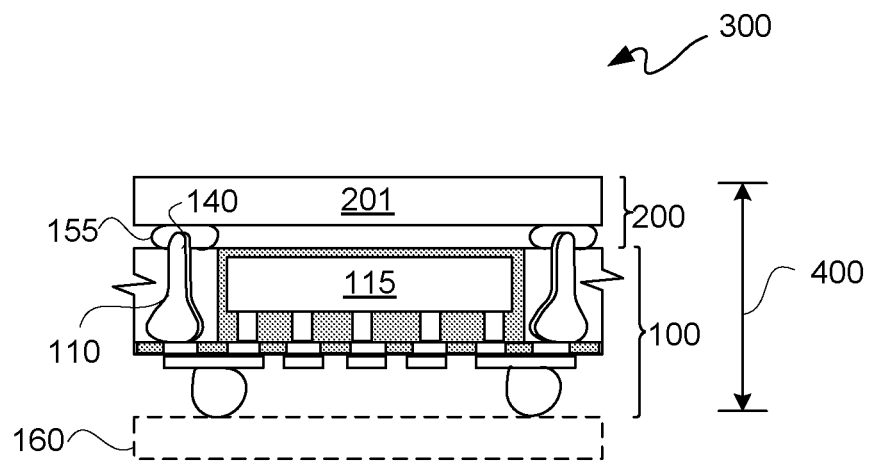
Figure 10:
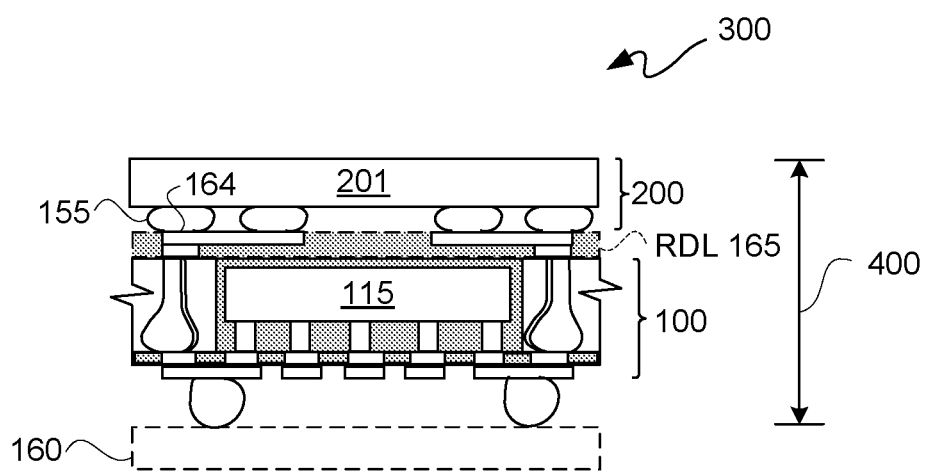
FIG. 10 is a block diagram of a cross-sectional side view depicting another exemplary PoP microelectronic package.

FIGS. 7-1 through 7-6 (collectively and singly "FIG. 7") are a progression of block diagrams of a cross-sectional side view depicting formation of another exemplary in-process microelectronic package 100 for WCSP with fan-out FO. FIGS. 7, 9 and 10 are hereafter described with simultaneous reference to FIG. 8, where there is shown a flow diagram depicting an exemplary process flow 800 for forming such other microelectronic package 100 for WCSP with fan-out FO.

At 601, a substrate having an upper surface and a lower surface opposite the upper surface is obtained. With reference to FIG. 7-1, in-process microelectronic package 100 includes a carrier 101 coupled to a foil substrate layer 103 with a releasable adhesive 102. In this example implementation, carrier 101 is a copper carrier, and foil substrate layer 103 is copper foil layer. However, in other implementations, carrier 101 may be silicon, glass, laminate, or other metal and/or dielectric carrier material. Carrier 101 may or may not be opaque, such as with respect to UV rays for example. Along those lines, releasable adhesive 102 may be a thermal or UV released adhesive for example. Moreover, in other implementations, foil substrate layer 103 may be another electrical conductor, such as gold, platinum or other thin film metal for example. Foil substrate layer ("substrate") 103 has an upper surface 104 and a lower surface 105 opposite such upper surface 104.

At 802, conductive pads or conductive islands may be formed in the substrate electrically isolated from a remainder of the substrate. The conductive pads may correspond to the wire bond wires for electrical conductivity between the wire bond wires and the conductive pads corresponding thereto as described below in additional detail.

With reference to FIG. 7-1, in-process microelectronic package 100 may have an upper surface 104 of substrate 103 directly written with a laser drill. In another implementation, patterning and etching may be used on upper surface 104. Through substrate channels 142 may be formed from upper surface 104 down to lower surface 105.

Through substrate channels 142 may be at least partially, if not completely, be filled with a dielectric material 143, such as a polyimide for example. Conductive pads 140 may be defined by such through substrate channels 142 in copper substrate 103 for this example implementation. Conductive pads 140 may be defined in substrate 103 as respective islands of a material of such substrate. In another implementation, substrate channels 142 may not be filled with any material, and conductive pads 140 may only be attached to carrier 101 via adhesive 102.

Conductive pads 140 may be formed using substrate 103 material for electrical isolation from a remainder of substrate 103, and such remainder of substrate 103 not used for conductive pads 140 may be used as a ground plane (not shown in this figure). However, for a face-down configuration as described with reference to FIG. 7 for example, conductive pads 140 may be formed for interconnection with posts or pads 117 of a microelectronic device 115, as described below in additional detail.

At 803, wire bond wires may be bonded to the upper surface of the substrate for extending away therefrom to a height above a microelectronic device, as described below in additional detail. With reference to FIG. 7-2, wire bond wires 110 are coupled to and extend away from upper surface 104. In this example, copper wire bond wires 110 are used. However, in another implementation, another form of wire bond wires 110 may be used, such as aluminum, silver, gold, palladium-coated copper ("PCC"), core wires, or other forms of wire bond wire. Wire bond wires 110 may be BVA™ bonded wires.

Again, in another example, a "wired-arch" or "wired-loop" wire bond wire 114 may be formed on upper surface 104 such that a first bond, such as a ball bond 113 for example, is formed at a first location on upper surface 104 and a second bond, such as a wedge or stitch bond 144, is formed at a second location on upper surface 104 spaced apart from such first location by at least approximately 10 microns for example. An upper surface 134 of such a "wired-arch" wire bond wire 114 may be used for interconnection, as described elsewhere herein. However, for purposes of clarity by way of example and not limitation, generally only wire bond wires 110, and not wired-arch wire bond wires 114, are further described.

Columns and/or rows ("rows") 112 of wire bond wires 110 may be spaced apart from one another to define a region 111 and may be coupled to upper surface 104. Such spacing between wire bond wires 110 may, though need not be uniform. For example, a denser spacing may be used in some locations as compared with other locations, as may vary from application to application depending on routing. Moreover, routing, including via RDL, may be denser in some areas as compare with other areas corresponding to layout of an integrated circuit die. Having the flexibility to have wire bond wires 110 use different spacings may be useful to accommodate shorter path distances and/or pin layout of a package.

In this example, wire bond wires 110 are ball bonded with corresponding ball bonds 113 to conductive pads 140 along upper surface 104. However, in another implementation, stitch, wedge, compliant, or other forms of BVA bonding may be used. For this implementation, which does not use soldering of wire bond wires 110, copper wire bond wires 110 may be attached with ball bonds to upper surface 104 of substrate 103 for substrate-to-upper package routing.

In some instances, no conductive pad 140 may be associated with a wire bond wire 110, such as for coupling to a ground plane or other voltage plane. Conductive pads 140 corresponding to wire bond wires 110 for electrical conductivity therebetween may be used for electrical communication with microelectronic package 100 and/or another microelectronic package as described below in additional detail.

Ball bonds 113, as well as wire bond wires 110 drawn therefrom, may be spaced apart from one another. Even though only single rows 112 spaced apart from one another are illustratively depicted in FIG. 7-2, in other implementations one or more rows 112 may be on one or more sides of region 111 defined by such rows 112. However, for purposes of clarity by way of example and not limitation, it shall be assumed that a single row 112 is located on each side of region 111 for defining such region for receipt of a microelectronic device. Moreover, wire bond wires 110 may extend to a height above a back side surface of such a microelectronic device, as described below in additional detail.

At 804, a microelectronic device having posts may be coupled in a face-down orientation to the upper surface of the substrate with first interconnects. In another implementation, operations at 803 and 804 may be in reverse order. Optionally, microelectronic device 115 may be coupled to an upper surface 104 by injecting an underfill 168 prior to molding.

With reference to FIG. 7-3, a microelectronic device 115 may be coupled to upper surface 104 in region 111. A microelectronic device 115 may be a bare IC or a packaged IC. Even though a single instance of an exemplary in-process microelectronic package 100 is illustratively depicted, two or more such in-process microelectronic packages 100 may be used. In another example, such in-process microelectronic package 100 may be a portion of a reconstituted wafer having multiple in-process microelectronic packages 100.

Microelectronic device 115 may be spaced apart from ball bonds 113 after coupling to upper surface 104. Posts or pads 117 may be coupled to corresponding conductive pads 140 by bonding, such as copper-to-copper as in this example. Accordingly, soldering may be avoided for this interconnection by having copper conductive pads 140 aligned with lower surfaces of posts 117. Although a copper-to-copper bond is illustratively depicted in FIG. 7, in another implementation a conventional reflow bond using a solder material may be used.

Along a lower front side surface of microelectronic device 115, conductive posts or pads 117 may extend away therefrom. In this example, lower ends of electrically conductive posts or pads 117 are over and above conductive pads 140 of microelectronic device 100. In this example, copper posts or pads 117 are used. However, in another example, another type of electrically conductive material may be used for posts or pads 117. Additionally, posts or pads 117 may be formed with a metalization layer used in forming microelectronic device 115. For purposes of clarity by way of example and not limitation, it shall be assumed that copper posts 117 are used for interconnects.

With reference to FIG. 7-4, microelectronic device 115 may be further coupled to upper surface 104 in a face-down or front side down orientation with an adhesive 716. Adhesive 716 may be injected between posts or pads 117 underneath microelectronic device 115. Additionally, adhesive 716 may extend into gaps between near surfaces of wire bond wires 110 and sidewalls of microelectronic device 115. Adhesive 716 may be deposited on a back side surface 724 of a packaged die or bare die integrated circuit of microelectronic device 115. Tips 123 of wire bond wires 110 may be above (i.e., higher than) an upper surface 725 of adhesive 716, or at least higher than back side surface 724. In another example, adhesive 716 may be an epoxy mold compound. In yet another example, adhesive 716 may be an underfill material which may extend into gaps between near surfaces of wire bond wires 110 and sidewalls of microelectronic device 115.

At 805, the substrate, the microelectronic device and the wire bond wires assemblage or combination may be molded with a molding material layer, which may include grinding or polishing such molding material layer. With reference to FIG. 7-5, a molding material layer 120 is formed over upper surface 104, microelectronic device 115, and wire bond wires 110. In this example, tips or upper ends 123 of wire bond wires 110 are above an upper surface 124 of molding material layer 120. Thus, tips 123 of wire bond wires 110 may be exposed after forming molding material layer 120. Surfaces 724 or 725 may or may not be covered by molding material layer 120. In another implementation, molding layer 120 may cover tips 123 followed by a grind or etch back to reveal upper ends of wire bond wires 110. For purposes of clarity by way of example and not limitation, it shall be assumed that tips 123 are exposed after forming molding material layer 120. Molding material layer 120 may be for forming a reconstituted wafer having multiple in-process microelectronic packages 100.

For a wired-arch wire bond wire 114, an upper surface 134 of such a wire arch 114 may be embedded or protrude above an upper surface 124 of molding material layer 120. After molding, carrier 101 may be removed along with adhesive 102. Again, adhesive 102 may be a releasable adhesive with temperature, UV rays, and/or other releasing agent.

In another implementation, molding material layer 120, as well as tips 123 of wire bond wires 110, or an upper arched surface 134 of wired-arch wire bond wires 114, may be ground or polished down to an upper surface 724 or 725. Removal of material such as by grinding may occur before or after removal of carrier 101. After grinding, upper ends 130, such as in FIG. 1-6, of wire bond wires 110 may be exposed for interconnections respectively thereto in such an implementation. After grinding, molding material layer 120 may be left in place around posts 117 and remaining portions of wire bond wires 110. However, for purposes of clarity by way of example and not limitation, it shall be assumed that tips 123 extend above an upper surface 124 of molding material layer 120, and that grinding of tips 123 is not used. For a wired-arch wire bond wire 114, after grinding of upper surface 134 of such a wire arch 114, first and second bonds thereof may be electrically disconnected from one another for example by grinding a protruding upper surface 134 to cause a break in such wire arch 114 leaving two at least temporarily exposed upper ends along upper surface 134. Along those lines, grinding may effectively form two separate wire bonds with different bond types, for example a ball bond 113 and a wedge or stitch bond 144.

At 806, the wire bond wires and the first interconnects may be interconnected via the conductive pads with a redistribution layer, where the redistribution layer has a first surface in contact with the conductive pads for the interconnecting. With reference to FIG. 7-6, an RDL 135 may be formed with a bottom surface thereof interconnected to upper surfaces of conductive pads 140 for interconnecting at least a portion of wire bond wires 110 with at least a portion of posts 117. Even though a single dielectric layer 137 and a single conductive layer 136 are illustratively depicted for RDL 135, in other implementations RDL 135 may include one or more dielectric and conductive layers. Along those lines, a PCB or other circuit board may be interconnected to RDL 135, as described below in additional detail.

Traces or pads 169 of conductive layer 136 may interconnect upper surfaces of conductive pads 140 for coupling upper ends of wire bond wires 110 and posts 117 to one another. Accordingly, wire bond wires 110 may provide "vertical interconnects" along sides of a microelectronic device 115 for interconnecting substrate 103 and RDL 135.

At 807, second interconnects may be attached to a second surface opposite the first surface of the redistribution layer. With continued reference to FIG. 7-6, balls or bumps 145 may be formed on exposed surfaces of traces or pads 169 of conductive layer 136. Such balls or bumps 145 may be mechanically isolated from electrical conductivity by one or more dielectric layers 137 of an RDL 135. However, such conductive traces or pads 169 of conductive layer 136 may be coupled for electrical conductivity with wire bond wires 110, as well as one or more posts 117, as previously described. Balls or bumps 145 for interconnection with posts 117 and not wire bond wires 110 are not illustratively depicted in this figure for purposes of clarity and not limitation.

At 808, third interconnects of another microelectronic device may be coupled to the conductive pads for electrical conductivity with the wire bond wires. With reference to FIG. 9, there is shown a block diagram of a cross-sectional side view depicting an exemplary PoP microelectronic package 300. In this example, a microelectronic package 100, which may still be in a reconstituted wafer or may be diced therefrom, has coupled on a back side thereof another microelectronic package 200. In other words, PoP microelectronic package 300 may be package-to-package assembled, package-to reconstituted wafer assembled, or wafer/reconstituted wafer to reconstituted wafer assembled, with the last three involving subsequent dicing. In this example, microelectronic devices 115 and 201 are respective packaged integrated circuit dies; however, in another example either or both microelectronic devices 115 and 201 may be bare integrated circuit dies.

Bumps or balls 155 of microelectronic package 200 may be physically coupled to tips 123, or upper surfaces 130 in another implementation, of wire bond wires 110 of microelectronic package 100 for electrical conductivity between microelectronic packages 100 and 200. PoP microelectronic package 300 may be coupled to a PCB or other circuit board 160 not part of PoP microelectronic package 300. Overall height 400 of PoP microelectronic package 300 may be approximately 1.5 mm or less. Optionally, an underfill (not shown) may be injected between microelectronic packages 100 and 200. For example, using BVA pins or wire tips 123 may thus avoid having to introduce another metal layer, such as another copper layer on a back side surface, such as either of surfaces 724 or 725 of FIG. 7-4, for example. Again, wire bond wires 110 may be disposed around a perimeter of microelectronic device 115.

With reference to FIG. 10, there is shown a block diagram of a cross-sectional side view depicting another exemplary PoP microelectronic package 300. In this example, a microelectronic package 100, which may still be in a reconstituted wafer or may be diced therefrom, has formed on a back side thereof another RDL 165. Another microelectronic package 200 may be coupled to an optional RDL 165. Along those lines, a bottom surface of RDL 165 may be interconnected to upper surfaces 130 of wire bond wires 110 of microelectronic package 100 for electrical conductivity therewith. Along those lines, tips 123 of FIG. 7-5 may be ground down to surface 124 for example.

Bumps or balls 155 of microelectronic package 200 may be physically coupled to conductive pads 164 of RDL 165 of microelectronic package 100 for electrical conductivity between microelectronic packages 100 and 200. PoP microelectronic package 300 may be coupled to a PCB or other circuit board 160 not part of PoP microelectronic package 300. Overall height 400 of PoP microelectronic package 300 may be approximately 1.5 mm or less.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A package-on-package device for wafer-level chip scale packaging with fan-out, comprising:
   a metal substrate having an upper surface and a lower surface opposite the upper surface;
   the substrate including outer conductive pads and inner conductive pads formed therein from material of the substrate electrically isolated from one another and from a remainder of the substrate;

lower ends of wire bond wires directly coupled to the outer conductive pads along the upper surface for electrical conductivity between the wire bond wires and the outer conductive pads associated therewith;

lower ends of first interconnects directly coupled to the inner conductive pads along the upper surface for electrical conductivity between the first interconnects and the inner conductive pads;

a redistribution layer having second interconnects coupled to the outer and the inner conductive pads along the lower surface for electrical conductivity between the outer and the inner conductive pads; and a microelectronic device directly coupled to upper ends of the first interconnects for electrical conductivity, wherein the outer conductive pads are located outside of a perimeter of the microelectronic device for the fan-out from the inner conductive pads located below the microelectronic device.

2. The package-on-package device according to claim 1, wherein the remainder of the substrate is a ground plane.

3. The package-on-package device according to claim 1, wherein the redistribution layer is a first redistribution layer, the package-on-package device further comprising a second redistribution layer with a bottom surface thereof interconnected to upper ends of the wire bond wires for electrical conductivity.

4. The package-on-package device according to claim 3, wherein the microelectronic device is a first microelectronic device, the package-on-package device further comprising:

a second microelectronic device interconnected to a top surface of the second redistribution layer for electrical conductivity to the upper ends of the wire bond wires through the second redistribution layer; and wherein the first interconnects are posts.

5. The package-on-package device according to claim 1, further comprising a molding material layer disposed around the posts and the microelectronic device.

6. The package-on-package device according to claim 5, wherein the molding material layer is a first molding material layer, the package-on-package device further comprising a second molding material layer disposed around the wire bond wires.

* * * * *